(12) United States Patent
Przeslawski et al.

(10) Patent No.: US 11,123,790 B2
(45) Date of Patent: Sep. 21, 2021

(54) APPARATUS FOR CASTING A MOLD

(71) Applicant: General Electric Company, Schenectady, NY (US)

(72) Inventors: Brian David Przeslawski, Liberty Township, OH (US); Gary Lee Lynn, Franklin, OH (US); Christoper Raymond Hanslits, Simpsonville, SC (US); Douglas G. Konitzer, West Chester, OH (US)

(73) Assignee: General Electric Company, Schenectady, NY (US)

( * ) Notice: Subject to any disclaimer, the term of this patent is extended or adjusted under 35 U.S.C. 154(b) by 250 days.

(21) Appl. No.: 15/996,038

(22) Filed: Jun. 1, 2018

(65) Prior Publication Data

US 2019/0111468 A1 Apr. 18, 2019

Related U.S. Application Data

(60) Provisional application No. 62/572,689, filed on Oct. 16, 2017.

(51) Int. Cl.
| | |
|---|---|
| *B22C 9/08* | (2006.01) |
| *B22D 21/04* | (2006.01) |
| *B22D 27/15* | (2006.01) |
| *B22D 27/04* | (2006.01) |
| *C30B 11/00* | (2006.01) |
| *B22D 27/06* | (2006.01) |

(52) U.S. Cl.
CPC ............... *B22C 9/08* (2013.01); *B22D 21/04* (2013.01); *B22D 27/045* (2013.01); *B22D 27/15* (2013.01); *B22D 27/06* (2013.01); *C30B 11/003* (2013.01); *H05B 2203/018* (2013.01)

(58) Field of Classification Search
CPC .......... B22C 9/08; B22D 21/04; B22D 27/04; B22D 27/045; B22D 27/06; B22D 27/15; C30B 11/003; H05B 2203/018
USPC ............. 164/256, 258, 259, 335, 338.1, 348
See application file for complete search history.

(56) References Cited

U.S. PATENT DOCUMENTS

| | | | |
|---|---|---|---|
| 3,607,475 | A | 9/1971 | Schrewelius |
| 4,590,983 | A | 5/1986 | Reuter et al. |
| 4,832,105 | A | 5/1989 | Nagan et al. |

(Continued)

FOREIGN PATENT DOCUMENTS

| | | |
|---|---|---|
| CN | 101429677 | 5/2009 |
| CN | 101954475 | 1/2011 |

(Continued)

*Primary Examiner* — Kevin P Kerns
(74) *Attorney, Agent, or Firm* — Dority & Manning, P.A.

(57) ABSTRACT

An apparatus for casting a part that includes a first housing, a second housing, a handling system and a cooling apparatus. The first housing defines a first chamber. The first chamber is configured to receive a melt heater and a mold heater. The second housing is configured to move between a first position and a second position such that when the second housing is in the first position, the first housing is open such that a mold can be inserted therein and when the second housing is in the second position, the second housing and the first housing define a second chamber. The cooling apparatus is configured to be positioned within the second chamber.

17 Claims, 3 Drawing Sheets

(56) References Cited

U.S. PATENT DOCUMENTS

| | | | |
|---|---|---|---|
| 5,046,547 A * | 9/1991 | Oti | B22D 27/045 |
| | | | 164/122.1 |
| 5,335,711 A * | 8/1994 | Paine | B22D 27/13 |
| | | | 164/120 |
| 5,611,670 A | 3/1997 | Yashinari et al. | |
| 5,941,297 A | 8/1999 | Young | |
| 5,974,077 A | 10/1999 | Abiko et al. | |
| 6,471,397 B2 | 10/2002 | Soderstrom et al. | |
| 6,844,532 B2 | 1/2005 | Takamura et al. | |
| 7,448,428 B2 | 11/2008 | Graham et al. | |
| 8,318,121 B2 | 11/2012 | Wambach et al. | |
| 8,329,133 B2 | 12/2012 | Schmid et al. | |
| 9,068,251 B2 | 6/2015 | Eber et al. | |
| 9,068,275 B2 | 6/2015 | Liu et al. | |
| 9,381,569 B2 | 7/2016 | Vogt et al. | |
| 9,457,531 B2 | 10/2016 | Ortiz | |
| 2012/0328470 A1 | 12/2012 | Watson | |
| 2016/0312322 A1 | 10/2016 | Kemmer et al. | |
| 2019/0111469 A1 | 4/2019 | Przeslawski et al. | |

FOREIGN PATENT DOCUMENTS

| | | |
|---|---|---|
| CN | 104907541 | 9/2015 |
| CN | 105149552 | 12/2015 |
| DE | 102014216766 | 2/2016 |
| EP | 1531020 | 5/2005 |
| EP | 1153681 | 11/2011 |

\* cited by examiner

APPARATUS FOR CASTING A MOLD

BACKGROUND OF THE INVENTION

This invention relates generally to an apparatus and a method for casting a mold and more particularly to an apparatus and a method for casting a single crystal part, intermediate component, or mold.

Some applications of metals require components or parts that are exceptionally wear resistant and heat resistant. Among these applications are engines such as aircraft engines. Conventionally, such durable components are produced from single crystal components. Such single crystal components are produced by precise cooling and controlled crystallization of a molten metal within a mold. The crystallization begins at a seed crystal and proceeds in a predetermined direction relative to the seed crystal.

One problem with such conventional methods of forming single crystal metal parts is that the process must be conducted in an inert atmosphere. This reduces the flexibility available in manufacturing the parts.

Another problem with conventional procedures and apparatuses for casting single-crystal parts is that it is difficult to optimize a cooling gradient for a part such that a best or optimum cast structure can be achieved.

Another problem with such conventional methods and apparatuses is that to be economically feasible many components must be produced per batch or run. This results in large equipment costs and process and material commitments. Another problem is that the conventional methods do not work well with molds for casting parts produced by additive manufacturing methods which tend to be smaller than conventional molds. Further, conventional technology does not work well with a single piece precision ceramic article.

BRIEF DESCRIPTION OF THE INVENTION

At least one of these problems is addressed by an apparatus and method that can provide for exposure of portions of the apparatus to air during the process and utilizes a single chamber as a melt chamber and as a mold chamber.

According to one aspect of the technology described herein, there is an apparatus for casting a part that includes a first housing, a second housing, a handling system and a means for cooling. The first housing defines a first chamber. The first chamber is configured to receive a melt heater and a mold heater. The second housing is configured to move between a first position and a second position such that when the second housing is in the first position, the first housing is open such that a mold can be inserted therein and when the second housing is in the second position, the second housing and the first housing define a second chamber. The means for cooling is configured to be positioned within the second chamber.

BRIEF DESCRIPTION OF THE DRAWINGS

The invention may be best understood by reference to the following description taken in conjunction with the accompanying drawing figures in which.

DETAILED DESCRIPTION OF THE INVENTION

Figure 1:
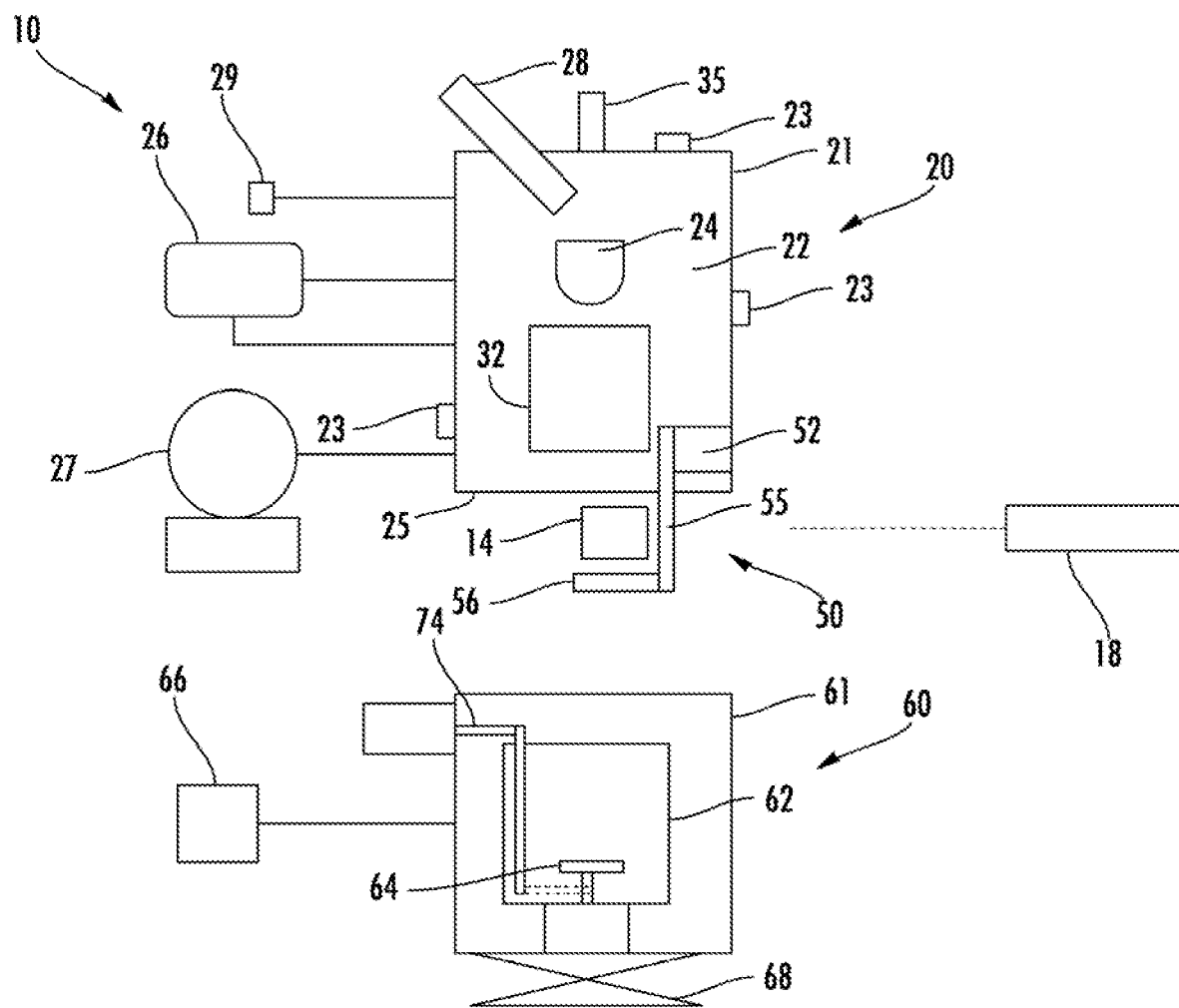
FIG. 1 is a schematic side elevation view of an exemplary investment casting apparatus positioned in a first configuration.

Referring to the drawings wherein identical reference numerals denote the same elements throughout the various views, FIG. 1 illustrates schematically an example of one type of suitable apparatus 10 for carrying out an embodiment of a casting method disclosed herein. The apparatus 10 provides for high temperature operation when open to the atmosphere and thus exposed to oxygen. Therefore a mold 14 can be introduced into the furnace while both the mold 14 and the mold heater 32 are hot. Therefore, the disclosed method supports a mold for casting a part (also sometimes referred to as a component, intermediate part, or mold) which is uniquely suited for an additively produced mold 14. According to the illustrated embodiment a single mold 14 is supported by the disclosed method. It should be appreciated that in some embodiments, multiple molds 14 can be utilized.

The apparatus 10 includes a furnace 20, a handling system 50, and a cooling apparatus 60. The furnace 20 is positioned near the cooling apparatus 60 such that the handling system 50 is positioned between the furnace 20 and the cooling apparatus 60. The furnace 20 includes a first housing 21 that defines a first chamber 22. A plurality of viewports 23 defined within walls of the housing 21 such that the first chamber 22 can be viewed from multiple angles. An opening 25 is configured to provide access to the first chamber 22 and is positioned in a bottom wall of the housing 21. Optionally, the opening 25 can be positioned in another location that would provide suitable access and utility.

The first chamber 22 is configured to contain a melt heater 24 that is a bottom pour skull melt heater in the illustrated embodiment and a mold heater 32. The mold heater 32 includes at least one high-power electric molybdenum disilicide (MoSi2) heating element for high temperatures as is conventionally known. The mold heater 32 can be exposed to oxidizing agents such as oxygen.

A pressure sensor 29 is fluidly connected to the first chamber 22 such that it can monitor the pressure within the first chamber 22. The pressure sensor 29 is electrically connected to a controller 18. A gas accumulator 26 is also fluidly attached to the first chamber 22. The gas accumulator 26 is configured to contain a gas to be used to purge the first chamber 22. The gas can be an inert gas such as argon. By way of example and not limitation, a suitable gas for purging can be one of the following: argon, air, nitrogen, helium, hydrogen, and a combination thereof. A temperature sensor 35 is positioned to monitor the temperature of metal within the melt heater 24. The temperature sensor 35 can be an optical or immersion thermocouple.

The controller 18 can be a general computer or a specialized controller configured to operate the furnace 20, the handling system 50 and the cooling apparatus 60. The controller 18 is configured to receive inputs from the pressure sensor 29 and from the temperature sensor 35.

An ingot chute 28 is positioned to deliver ingots of metal to the melt heater 24 to be melted within the melt heater 24. By way of example and not limitation, such ingots can be the following metals: aluminum, nickel, iron, cobalt, and a combination thereof.

The handling system 50 includes a lift apparatus 52 and an arm 55. The arm 55 is movably connected to the lift apparatus 52 such that operation of the lift apparatus 52 causes movement of the arm 55. The lift apparatus 52 and the arm 55 can be configured as a rack and pinion or other such device known for controlled movement. A mold holder 56 is positioned at a distal end of the arm 55 such that the mold holder 56 moves with the arm 55. The mold holder 56 is configured to receive a mold 14. The mold holder 56 could be water cooled depending on the cooling apparatus used.

The mold 14 can be a conventional mold for investment casting or can be a mold produced by procedures such as additive manufacturing.

Figure 2:
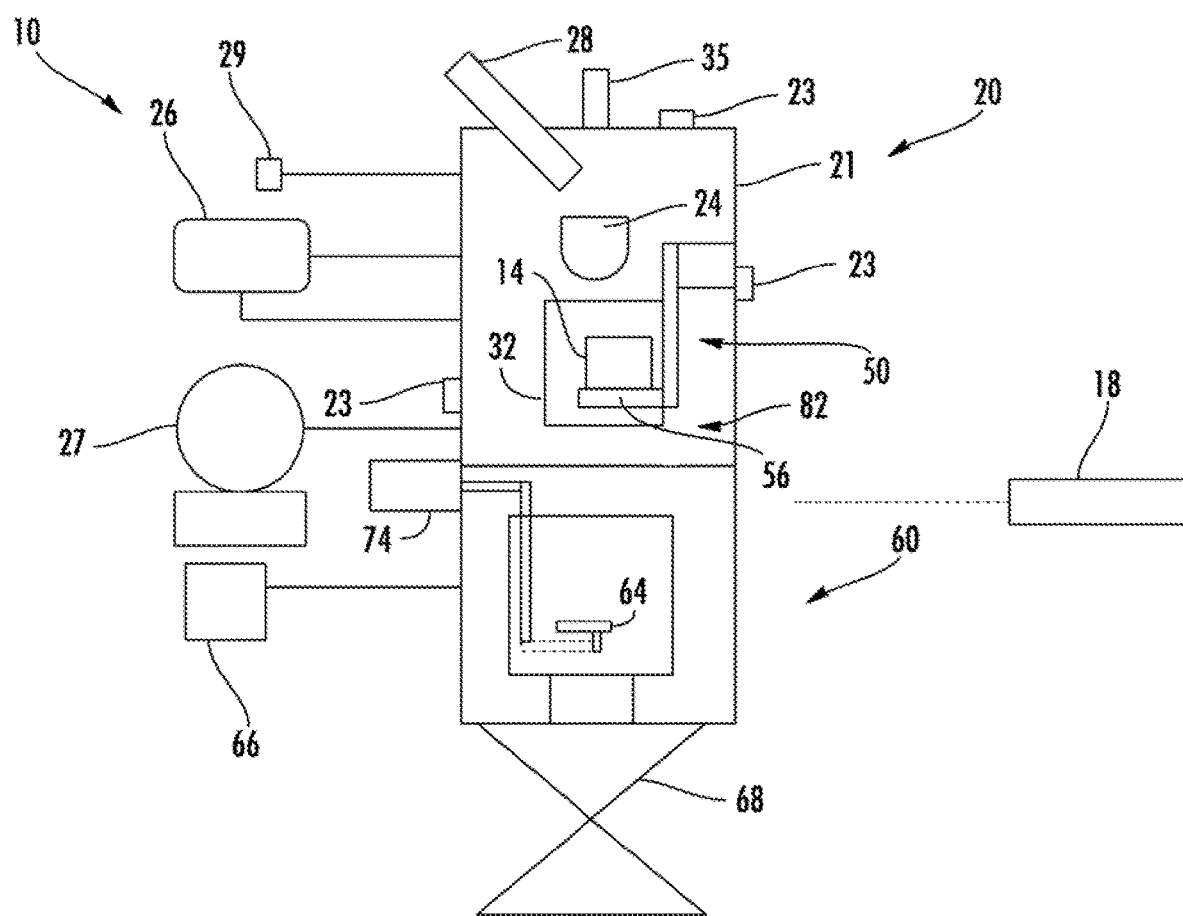
FIG. 2 is a schematic side elevation view of the apparatus of FIG. 1 positioned in a second configuration.
Figure 3:
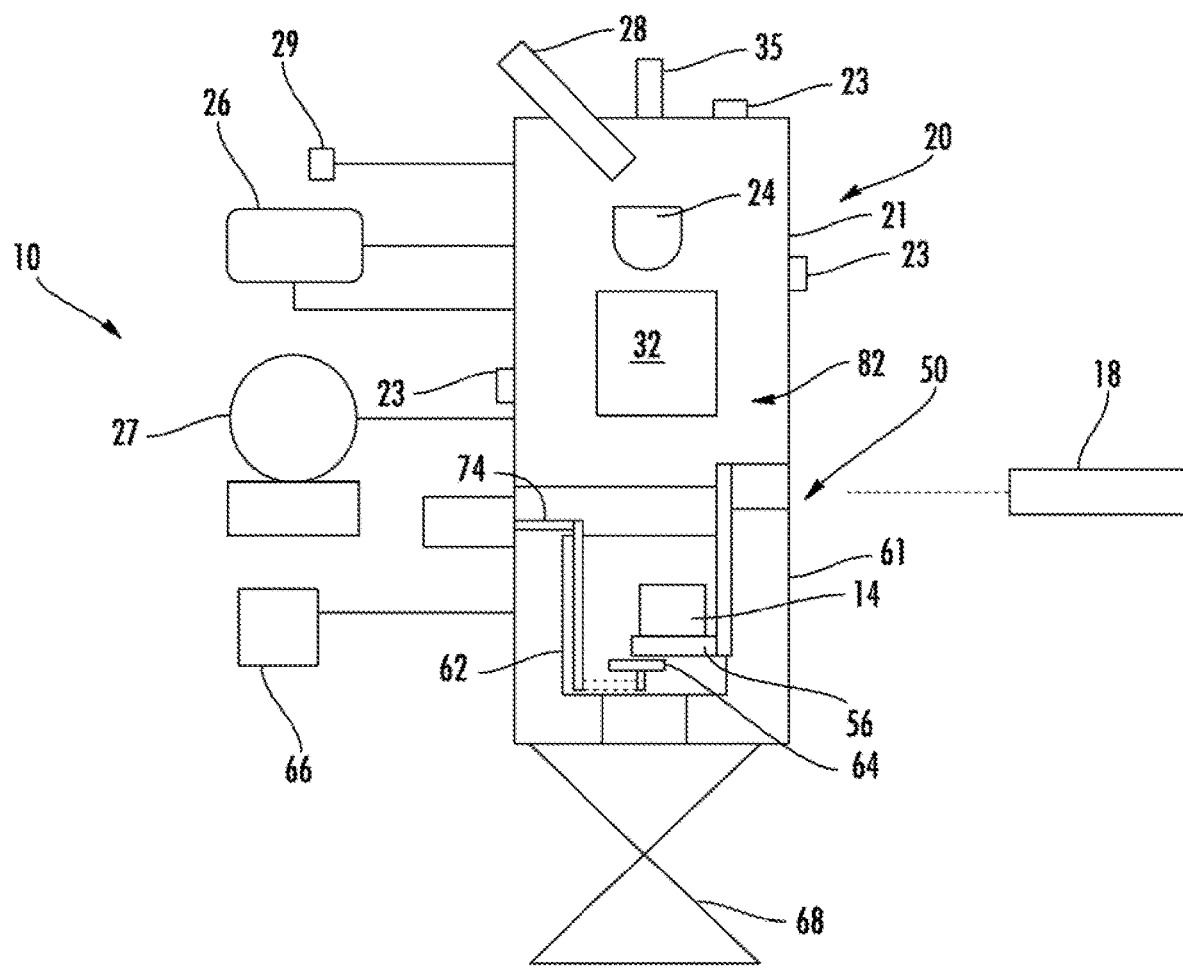
FIG. 3 is a schematic side elevation view of the apparatus of FIG. 1 positioned in a third configuration.

Referring now to FIGS. 1, 2, and 3, the handling system 50 is configured to move between a first position, a second position, and a third position. In the first position, the mold holder 56 of the handling system 50 is positioned outside of the furnace 20 and outside of the cooling apparatus 60 as shown in FIG. 1. In the second position, the mold holder 56 of the handling system 50 is positioned within the furnace 20 as shown in FIG. 2. In the third position, the mold holder 56 of the handling system 50 is positioned within the cooling apparatus 60 as shown in FIG. 3.

In this manner, the mold 14 can be loaded onto the handling system 50 and then inserted into the furnace 20 via movement of the handling system 50 between the first position and the second position such that the mold can be introduced into the furnace 20 in an initial step and can be removed from the furnace 20 in a subsequent step. The handling system 50 is positioned adjacent the furnace 20 and the cooling apparatus 60 such that the handling system 50 can transfer a mold 14 into the furnace 20, from the furnace 20 to the cooling apparatus 60 and then out of the cooling apparatus 60.

Referring now to FIG. 1, the cooling apparatus 60 includes a cooling housing 61 which is configured to receive a vessel 62. A mixing propeller 64 and a heater 66 are positioned within the vessel 62. A mixer 74 is configured to circulate a liquid metal bath contained within the vessel 62 in conjunction with mixing propeller 64. In the illustrated embodiment, the liquid metal bath is tin (Sn). By way of example and not limitation, the liquid metal bath can be the following: tin, aluminum, gallium, and a combination thereof.

The cooling housing 61 is a second housing and is supported by a lift 68. The lift 68 is positioned to move between a lowered first position and a raised second position such that the first housing 21 and the cooling housing 61 move relatively to each other. When the lift 68 is in the first position, the cooling apparatus 60 is positioned apart from the furnace 20 as shown in FIG. 1. When the lift 68 is in the raised second position, the cooling housing 61 is sealingly engaged with the housing 21 of the furnace 20 as shown in FIGS. 2 and 3. Together the cooling housing 61 and the housing 21 define a large second chamber 82. The large chamber 82 is configured to function both as a melting chamber and a mold chamber in accordance with the method described below.

The lift 68 is configured to be controlled by the controller 18 in cooperation with the lift apparatus 52 such that the mold holder 56 can be introduced into and removed from the vessel 62. In this way, a mold 14 containing molten metal can be introduced into the cooling apparatus 60 and cooled via a means of cooling, and thus solidified, in a controlled manner as will be described in more detail in the method below. In the illustrated embodiment, the means of cooling is a liquid metal bath, such as molten tin. It should be appreciated that the cooling apparatus 60 can be configured to utilize a broad range of mold cooling methods as the means for cooling. These methods can include radiation cooling, forced gas cooling, liquid metal cooling, fluidized bed cooling.

A dry vacuum pump 27 is electrically connected to the controller 18 and fluidly connected to the first chamber 22 and thus large chamber 82. The pump 27 is configured to withdraw gases contained therein to create a reduced pressure environment. It should be appreciated that types of vacuum pumps other than dry vacuum pumps can be used as pump 27 in other embodiments. The housing 21 is configured such that a hard vacuum can be generated with the pump 27 within the first chamber 22. In some embodiments, the vacuum can be about 0.015 Torr. An example operating pressure is 200 Torr such that the pressure within the first chamber 22 can be determined by the controller 18 via the introduction or withdrawal of gas and operation of the pump 27 to withdraw gases such as atmospheric gasses from the first chamber 22.

The presently disclosed technology can be better understood from a description of the operation thereof. As indicated above, the apparatus 10 is used in the investment process of casting. More specifically, the apparatus 10 is utilized to cast single crystal metallic components or intermediate structures that are directionally solidified in a more efficient and simplified manner than conventional methods. It should be appreciated that the sequence of steps shown below can vary in different embodiments as would be understood by one skilled in the art.

The disclosed technology provides a method for casting a mold, the method includes the following steps: a loading step, a pressure reducing step, a pouring step, a solidifying step, and an unloading step.

Referring now to the loading step, it includes the following steps: A) Preheating a mold 14 prior to introducing the mold 14 into the furnace 20. More preferably, preheating the mold to greater than about 2200° F. In some embodiments, the mold 14 is preheated to about 2800° F. As used herein, the term "preheating" refers to heating the mold 14 above ambient temperature prior to introduction of the mold 14 into the mold heater 32. B) Placing the mold 14 on the mold holder 56. C) Operating the handling system 50. D) Introducing the mold 14 into the furnace 20 such that the mold 14 is positioned within the mold heater 32. E) Operating lift 68 such that cooling housing 61 is engaged with housing 21 thus defining large chamber 82. F) The mold heater 32 is operated to maintain the mold 14 at a predetermined temperature. Preferably, the predetermined temperature is about 2200° F. G) Loading an ingot via ingot chute 28 into the melt heater 24. Loading an ingot can be done prior to, during, or just after the step of introducing the mold 14 into the furnace.

Referring now to the pouring step, it includes the following steps: A) Reducing the pressure with the chamber 82 below atmospheric pressure by operating the pump 27. B) Introducing a gas such as argon into the first chamber 22 to replace the previous gasses within chamber 82. C) Reducing the pressure within chamber 82 from atmospheric pressure to a purge pressure. The purge pressure may be in a range of from 100 to 300 Torr or it may be in a range of 150 Torr to 250 Torr or it may be in a range of 190 Torr to 210 Torr and is preferably 200 Torr. As used herein, the term "purge" refers to or is related to the process of replacing the gas or atmosphere previously within the second chamber 82. C) Melting the ingot in the melt heater 24. D) Reducing pressure further to a pressure for pouring. The pressure for pouring can be from 0.005 Torr to 0.05 Torr or the pressure for pouring can be from 0.01 Torr to 0.03 Torr or the pressure for pouring can be from 0.0125 Torr to 0.0175 Torr or the pressure for pouring can be 0.015 Torr. The pressure for pouring is chosen to minimize gas bubbles within the molten metal and to aid in filling the mold 14 with the molten metal. E) Pouring the molten metal from the melt heater 24 into the mold 14.

Referring now to the solidifying step, it includes the following steps: A) Introducing gas from accumulator 26 to maintain a pressure within the chamber 82 at a generally constant pressure. Preferably, the pressure is about 200 Torr. C) Removing the mold 14 from the mold heater 32 by operating the handling system 50. D) Engaging the mold 14 within the means of cooling. Thus in the illustrated embodiment the mold 14 is positioned within the vessel 62 such that it is surrounded by the liquid metal bath. D) Keeping the mold 14 engaged with the means of cooling for a predetermined time. Preferably the predetermined time is between about 2 minutes and about 30 minutes, more preferably the predetermined time is between about 10 minutes and about 20 minutes and even more preferably the predetermined time is about 15 minutes.

Referring now to the unloading step, it includes the step of operating the lift 68 such that the cooling apparatus 60 is disengaged from the furnace 20 and the mold 14 is positioned between the furnace 20 and the cooling apparatus 60 such that it can be removed. The process can then be repeated with a new mold 14.

The technical advantages of the disclosed method and apparatus include optimization of cooling gradient to achieve the best cast structure. Such a cast structure would include less elemental segregation, crystal defects and porosity. Another technical advantage is that a bottom pour skull melt can be utilized with the disclosed technology thereby achieving better cleanliness and chemical stability. Another technical advantage is that the mold can be loaded directly from a fire or preheat apparatus thereby minimizing thermal cycles. Thus a printed, fired and/or preheated mold can be loaded directly into the furnace. Another technical advantage is improved fill consistency from gas backfill within cycle.

The commercial advantages associated with the disclosed technology include low cost support for casting with directional solidification in a manner uniquely suited for additive manufacturing or 3D printing produced molds. The disclosed technology allows for a mold produced by a 3D printing or additive manufacturing method to be loaded directly into a hot furnace in a preheated state.

The foregoing has described a method and apparatus for casting a mold. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. An apparatus for casting a part, the apparatus comprising:
    a first housing that defines a first chamber and the first chamber is configured to receive a melt heater and a mold heater;
    a second housing that defines a second chamber, the second housing being configured to move between a first position and a second position such that when the second housing is in the first position, the first housing is open to the atmosphere and configured to have a mold inserted therein and the second housing is open to the atmosphere and when the second housing is in the second position, the second housing and the first housing cooperatively define a third chamber that encompasses the first and second chambers that together define an open volume within the first and second housings, the third chamber being closed to the atmosphere and configured to function both as a melting chamber and a mold chamber;
    a handling system;
    a lift supporting the second housing and operable to move the second housing between the first position and the second position; and
    a means for cooling configured to be positioned within the third chamber.

2. The apparatus according to claim 1, wherein the means for cooling is positioned within the second housing.

3. The apparatus according to claim 2, wherein the melt heater is a bottom pour skull melt heater.

4. The apparatus according to claim 1, wherein the mold heater is configured to be exposed to oxygen when heated to a predetermined temperature.

5. The apparatus according to claim 1, wherein the mold heater includes at least one molybdenum disilicide heating element.

6. The apparatus according to claim 5, wherein the predetermined temperature is greater than 2200° F.

7. The apparatus according to claim 6, wherein the predetermined temperature is 2200° F. to 2800° F.

8. The apparatus according to claim 1, further comprising an inert gas accumulator is fluidly connected to the first chamber.

9. The apparatus according to claim 8, wherein the inert gas accumulator is charged with one of the following: argon, air, nitrogen, helium, hydrogen, and a combination thereof.

10. The apparatus according to claim 9, wherein the inert gas accumulator is charged with argon.

11. The apparatus according to claim 1, wherein the handling system includes a mold holder that is configured to receive a mold.

12. The apparatus according to claim 11, wherein the handling system is configured to move the mold between the mold heater and the means for cooling.

13. The apparatus according to claim 1, wherein the means for cooling is a liquid metal bath.

14. The apparatus according to claim 13, wherein the liquid metal bath is tin.

15. The apparatus according to claim 1, wherein the means for cooling is radiation cooling.

16. The apparatus according to claim 1, wherein the means for cooling is forced gas cooling.

17. The apparatus according to claim 1, wherein the means for cooling is fluidized bed cooling.

\* \* \* \* \*